United States Patent
Rusconi Clerici Beltrami et al.

(10) Patent No.: US 11,997,462 B2
(45) Date of Patent: May 28, 2024

(54) METHOD FOR MANUFACTURING A TRANSDUCER UNIT

(71) Applicant: USOUND GMBH, Graz (AT)

(72) Inventors: Andrea Rusconi Clerici Beltrami, Vienna (AT); Ferruccio Bottoni, Graz (AT); Nick Renaud-Bezot, Vienna (AT)

(73) Assignee: USOUND GMBH, Graz (AT)

( * ) Notice: Subject to any disclaimer, the term of this patent is extended or adjusted under 35 U.S.C. 154(b) by 795 days.

(21) Appl. No.: 17/016,697

(22) Filed: Sep. 10, 2020

(65) Prior Publication Data

US 2021/0084423 A1  Mar. 18, 2021

(30) Foreign Application Priority Data

Sep. 12, 2019 (DE) ............. 10 2019 124 595.8

(51) Int. Cl.
*H04R 31/00* (2006.01)
*B81B 3/00* (2006.01)

(52) U.S. Cl.
CPC ......... *H04R 31/003* (2013.01); *B81B 3/0021* (2013.01); *H04R 31/006* (2013.01); *B81B 2203/0127* (2013.01); *H04R 2201/003* (2013.01); *H04R 2307/025* (2013.01)

(58) Field of Classification Search
None
See application file for complete search history.

(56) References Cited

U.S. PATENT DOCUMENTS

| | | | |
|---|---|---|---|
| 6,087,760 | A | 7/2000 | Yamaguchi et al. |
| 9,516,421 | B1 | 12/2016 | Loeppert et al. |
| 10,710,282 | B2 | 7/2020 | Otto et al. |
| 10,710,874 | B2 | 7/2020 | Frischmuth et al. |
| 2003/0107300 | A1 | 6/2003 | Nakamura et al. |
| 2011/0048138 | A1 | 3/2011 | Li |
| 2011/0064250 | A1 | 3/2011 | Jeong et al. |

(Continued)

FOREIGN PATENT DOCUMENTS

| | | |
|---|---|---|
| DE | 198 09 207 | 8/1999 |
| DE | 603 13 715 T2 | 1/2008 |

(Continued)

OTHER PUBLICATIONS

The foreign Office Action with English translation for application No. EP 20195530.9, dated Mar. 15, 2023, 12 pages.

(Continued)

*Primary Examiner* — Alexander G Ghyka (74) *Attorney, Agent, or Firm* — Dority & Manning, P.A.

(57) ABSTRACT

A method for manufacturing a transducer unit for converting electrical signals into deflections and/or deflections into electrical signals, in which a transducer element is arranged on a support element, which is coupled to a diaphragm unit, which is deflectable along a stroke axis, includes the step of casting a fluid and curable diaphragm material onto a reinforcing element of the diaphragm unit to form a flexible diaphragm element. The diaphragm unit is coupled or coupleable to the transducer element. The diaphragm element, together with the reinforcing element, at least partially form the diaphragm unit. A transducer unit includes a diaphragm unit having a reinforcing element and a flexible diaphragm element formed of a fluid and curable diaphragm material that has been cast onto the reinforcing element.

14 Claims, 2 Drawing Sheets

(56) References Cited

U.S. PATENT DOCUMENTS

2012/0093353 A1   4/2012   Windischberger et al.
2012/0270352 A1   10/2012   Huffman et al.
2014/0270325 A1   9/2014   Poynot et al.
2019/0387321 A1   12/2019   Dayton et al.

FOREIGN PATENT DOCUMENTS

| DE | 102016118438 A1 | 6/2017 |
|----|----|----|
| DE | 102016111909 | 1/2018 |
| DE | 112016005797 T5 | 11/2018 |
| JP | S 513218 A | 1/1976 |
| WO | WO 2005/075953 A1 | 8/2005 |
| WO | WO 2018/148485 A1 | 8/2018 |

OTHER PUBLICATIONS

Partial European Search Report, dated Oct. 28, 2020, 25 pages.
German Search Report and Translation, dated Aug. 18, 2020, 27 pages.
Concise Explanation of Relevance for DE 603 13 715 T2, Sep. 15, 2020, 1 page.

METHOD FOR MANUFACTURING A TRANSDUCER UNIT

FIELD OF THE INVENTION

The present invention relates to a method for manufacturing a transducer unit, in particular a MEMS transducer unit, for converting electrical signals into deflections and/or deflections into electrical signals, in which at least one transducer element is arranged on a support element, and the transducer element is coupled to a diaphragm unit, which is deflectable along a stroke axis. Moreover, the invention relates to a transducer unit.

BACKGROUND OF THE INVENTION

DE 603 13 715 T2 describes a method for manufacturing a transducer unit. This takes place in that a sacrificial layer is applied onto a substrate. Thereafter, a diaphragm layer, a lower electrode layer, an active layer, and an upper electrode layer are consecutively applied. A disadvantage thereof is that the manufacturing method is complex.

OBJECTS AND SUMMARY OF THE INVENTION

The object of the present invention is therefore to create a flexible manufacturing method for a transducer unit and a transducer unit.

The object is achieved by means of a method for manufacturing a transducer unit described more fully below, and by a transducer unit having the features described more fully below.

The invention relates to a method for manufacturing a transducer unit for converting electrical signals into deflections and/or deflections into electrical signals. The transducer unit can be a MEMS transducer unit, which comprises a piezoelectric actuator. In one application, the transducer unit can be utilized for generating and/or detecting sound waves in the audible wavelength spectrum and/or in the ultrasonic range. In this application, the electrical signals can be audio signals, which are converted into deflections, which, in turn, generate sound waves. The transducer unit can therefore be a loudspeaker and/or a microphone. As a microphone, the transducer unit converts the deflections, which originate from sound waves, into the electrical signal or the audio signal. The transducer unit can be a sound transducer, in particular a MEMS sound transducer, or an electrodynamic sound transducer. When sound waves in the ultrasonic range are generated and/or detected, these can be utilized, for example, for technical test instruments or in ultrasonic devices for sonography.

Additionally or alternatively, the transducer unit can also be utilized as an actuator, wherein, for example, a pressure or a force is generated with the aid of the deflection. Moreover, the transducer unit can also be utilized as a sensor when a process induces a deflection, for example, a pressure or a force, which is then converted by the transducer unit into an electrical signal.

In the method, at least one transducer element is arranged on a support element. The support element can be, for example, a support substrate. The at least one transducer element for generating and/or detecting the sound waves is therefore arranged on the support element. The transducer element can convert the electrical signal or a voltage into a deflection, and so, as a result, for example, the sound waves can be generated. The transducer element can also convert the deflections into the electrical signal or the voltage, however, and so, as a result, for example, the sound waves can be detected. The support element can be, for example, a circuit board and/or can comprise electrical lines for the transducer element.

Moreover, the transducer element is coupled to a diaphragm unit, which is deflectable along a stroke axis. With the aid of the coupling, the deflections can be exchanged between the diaphragm unit and the at least one transducer element. The transducer element can deflect the diaphragm unit according to an electrical signal or act upon the diaphragm unit with vibrations, for example, in order to generate the sound waves, and so the diaphragm unit also causes the air situated above the diaphragm unit to vibrate, so that the sound waves are generated. By comparison, the air vibrating due to the sound waves can also cause the diaphragm unit to vibrate, which, in turn, is transmitted to the transducer element. The transducer element converts the vibrations into an electrical signal, i.e., the audio signal.

According to the invention, in order to form at least one flexible diaphragm element, a fluid and curable diaphragm material is cast, at least in some areas, onto a reinforcing element of the diaphragm unit, which is coupled or coupleable to the transducer element. The diaphragm element and the reinforcing element, together, at least partially form the diaphragm unit. The diaphragm material can be, for example, a polymer. Furthermore, the diaphragm material can be a silicone. The diaphragm material can be a thermoplastic, an elastomer, or thermosetting plastic. Since the diaphragm element is flexible, it can be deflected together with the reinforcing element, and so the diaphragm unit can be deflected. The reinforcing element itself can be flexible, although it has less flexibility than the at least one diaphragm element. A rigidity of the reinforcing element is greater than that of the diaphragm element. The reinforcing element can also be rigid, however. Consequently, only the at least one diaphragm element curves or bends when the diaphragm unit is deflected.

Due to the casting of the at least one diaphragm element onto the reinforcing element, the manufacturing method can be simplified. In addition, a flexible manufacturing method is created as a result, since, due to the casting of the fluid diaphragm material, any shape of the transducer unit and/or the reinforcing element can be considered. An adaptation, in advance, of the diaphragm unit to various shapes of the transducer unit can therefore be dispensed with.

The acoustic properties of the transducer unit also depend on the flexibility of the diaphragm element, when the transducer unit is utilized as a sound transducer. Less flexibility or greater rigidity dampens, for example, the acoustic properties. By comparison, if the transducer unit is utilized, for example, as a pressure sensor, a pressure range in which the transducer unit can measure the pressure can be established by way of the selection of the flexibility of the diaphragm element. It is clear that, at high pressures, the diaphragm element must have less flexibility, in order to be able to limit its own deflection. The flexibility can be selected with the aid of the diaphragm material or the composition of the diaphragm material. For example, for less flexibility, a diaphragm material can be selected, which has a higher modulus of elasticity after curing. Additionally or alternatively, a thickness of the at least one diaphragm element can also be varied, in order to adapt its flexibility or rigidity.

It is advantageous when the fluid and curable diaphragm material is cast onto the reinforcing element in such a way that the at least one flexible diaphragm element and/or the diaphragm unit are/is formed separately from the transducer element. Additionally or alternatively, the reinforcing element can also be arranged in such a way that the at least one flexible diaphragm element and/or the diaphragm unit are/is formed separately from the transducer element. Due to the separation of the at least one flexible diaphragm element and/or the diaphragm unit from the transducer element, the transducer unit can have a modular design. In particular, after the curing of the diaphragm material, the transducer element and the diaphragm unit are separated from each other or are connected to each other only via a coupling.

It is advantageous when the at least one transducer element is coupled to the at least one reinforcing element and, thereafter, the diaphragm element is cast thereon. As a result, first, a fixed connection is formed between the reinforcing element and the transducer element and, thereafter, the diaphragm element is arranged at the unit made up of the transducer element and the reinforcing element.

It is advantageous when the at least one transducer element is arranged in a receiving space of a dam arrangement. The dam arrangement can be arranged on the support element first, followed by the transducer element. Alternatively, it is also possible that the transducer element is arranged on the support element first, followed by the dam arrangement. The dam arrangement has a shape of a frame on the support element comprising the receiving space. The fluid diaphragm material can be filled into the dam arrangement or the receiving space formed thereby. With the aid of the dam arrangement, the fluid diaphragm material can be retained or retained at the area, at which the at least one diaphragm element is to be formed.

If the transducer element is arranged in the receiving space, the dam arrangement completely borders the transducer element. Furthermore, the dam arrangement also completely borders the reinforcing element when it is coupled to the transducer element.

It is advantageous when the at least one diaphragm element is cast onto the reinforcing element in a transverse direction oriented transversely to the stroke axis. The reinforcing element comprises a peripheral side, which extends transversely to the stroke axis around the reinforcing element. The at least one diaphragm element is therefore cast onto the peripheral side of the reinforcing element. Furthermore, the peripheral side faces the dam arrangement. When the diaphragm element is cast, in the transverse direction, onto the reinforcing element and, therefore, is formed, it enlarges an area of the diaphragm unit, and so, for example, an acoustic performance of the transducer unit is increased.

Additionally or alternatively, it is advantageous when the at least one diaphragm element is cast onto the dam arrangement. Since the dam arrangement is fixedly connected to the support element, the diaphragm unit has an anchoring point with the support substrate with the aid of the coupling of the diaphragm element to the dam arrangement. Thereupon, the diaphragm unit can vibrate or be deflected according to an audio signal, in order to generate a sound when the transducer unit is utilized as a loudspeaker. The diaphragm unit is therefore clamped at the dam arrangement via the diaphragm element. The diaphragm unit is fastened to the dam arrangement.

Additionally or alternatively, it is advantageous when the at least one diaphragm element is arranged between the reinforcing element and the dam arrangement. Since the dam arrangement can extend completely around the reinforcing element, the at least one diaphragm element can be arranged completely in the area between the dam arrangement and the reinforcing element. The diaphragm unit can also form a closed area with the dam arrangement when the at least one diaphragm element is arranged between the reinforcing element and the dam arrangement. Consequently, the diaphragm unit can act upon a surrounding medium, such as air, with pressure and/or vibrations in order to generate and/or detect sound.

It is advantageous when the diaphragm material is cast in the direction of the stroke axis at least partially onto a first side face and/or a second side face of the reinforcing element, and so the is formed at least partially at the first and/or the second side face(s) of the reinforcing element. The diaphragm material can also be cast in an edge area of the first and/or the second side face(s) of the reinforcing element. The reinforcing element can have, for example, a thickness in the direction of the stroke axis of only a few μm, for example, 1 μm-5 μm. The peripheral side is therefore appropriately small, and so, in order to improve the connection between the reinforcing element and the at least one diaphragm element, the diaphragm material is cast around the first and/or the second side face(s), for example, in their edge areas. Consequently, the reinforcing element is surrounded by the at least one diaphragm element. As a result, the diaphragm element at least partially encompasses the reinforcing element. A connection between the at least one diaphragm element and the reinforcing element is improved as a result.

Furthermore, sections of the reinforcing element, in particular at the first and/or the second side face(s), can be roughened, for example, with the aid of chemical processes, and so a form-locking connection can be formed between the reinforcing element and the diaphragm element.

It is advantageous when the dam arrangement, the transducer element and/or the reinforcing element are arranged with respect to each other in such a way that the reinforcing element is spaced apart from the dam arrangement. Consequently, the reinforcing element can be contactlessly and/or freely deflected with respect to the dam arrangement.

It is advantageous when the at least one diaphragm element is arranged in such a way that it is spaced apart from the transducer element. For this purpose, the diaphragm material is cast onto the reinforcing element in such a way that the diaphragm element formed as a result is spaced apart from the transducer element. As a result, the flexible diaphragm element is not obstructed by the transducer element during deflection.

It is advantageous when the reinforcing element and/or the transducer element are/is arranged coaxially to the dam arrangement. Additionally or alternatively, the reinforcing element and the transducer element can also be arranged coaxially to one another. As a result, the vibrational properties of the diaphragm unit can be improved when the transducer unit is utilized, for example, as a sound transducer. As a result, the diaphragm unit can be deflected without, for example, tilting, or without the orientation of the diaphragm unit changing during the deflection.

It is advantageous when the dam arrangement is adhesively bonded on the support element. Additionally or alternatively, the dam arrangement can also be formed as one piece with the support element during the formation of the support element. Furthermore, for example, a template can be placed onto the support element, which is filled with a dam material, out of which the dam arrangement is formed. The dam material can also be, for example, a polymer.

It is advantageous when a coupling element is arranged between the transducer unit and the reinforcing element. With the aid of the coupling element, the transducer unit can be coupled to the reinforcing element. Additionally or alternatively, the coupling element is arranged between the transducer unit and the reinforcing element a coupling element in order to space the transducer unit apart from the reinforcing element. As a result, it can be achieved that the reinforcing element or the diaphragm unit is still spaced apart from the transducer unit at a maximum deflection of the diaphragm unit and, therefore, of the reinforcing element. As a result, the diaphragm unit is prevented from impacting the transducer unit upon deflection of the diaphragm unit. Furthermore, the coupling element can be formed as one piece with the transducer element or the reinforcing element. Alternatively, the coupling element can also be connected to the transducer element or to the reinforcing element first, and, thereupon, to the appropriate counterpart, i.e., the reinforcing element or the transducer element.

It is advantageous when the diaphragm material for forming the at least one diaphragm element is poured into a diaphragm volume, which adjoins the reinforcing element in a transverse direction oriented transversely to the stroke axis. The diaphragm volume is therefore the volume, at which the diaphragm element is to be formed. Additionally or alternatively, the diaphragm volume can be arranged in the transverse direction between the reinforcing element and the dam arrangement.

It is advantageous when at least one filling volume in the receiving space is cast with a fluid and curable filling material. After the curing, a filling element therefore forms in the receiving space. The filling material can be cast onto the reinforcing element, onto the transducer element, and/or onto the dam arrangement. Additionally or alternatively, the filling element can also be cast onto the at least one, in particular cured, diaphragm element. The filling element is also flexible. Preferably, the filling element can have greater flexibility than the diaphragm element. With the aid of the filling element, for example, the acoustic properties of the transducer unit can be changed and/or determined when the transducer unit is utilized as a sound transducer. The at least one filling volume adjoins the diaphragm element and/or is spaced apart therefrom.

It is advantageous when the filling material is poured into the receiving space before and/or after the diaphragm material is cast or has been cast onto the reinforcing element. Therefore, for example, a filling material can be poured into the receiving space first, then the diaphragm material can be cast onto the reinforcing element and, thereupon, a filling material can be poured into the receiving space again. Consequently, the transducer unit can be manufactured step-by-step.

It is advantageous when at least one pouring port is formed in the support element, and so the diaphragm material and/or the filling material can be poured in through the pouring port. As a result, the diaphragm material and/or the filling material can be poured into the receiving space.

It is advantageous when the diaphragm unit is arranged at a top side of the transducer unit and the pouring port is arranged at an underside, wherein the diaphragm material and/or the filling material are/is poured in from the direction of the underside.

It is advantageous when the reinforcing element and/or the dam arrangement are/is placed upon an auxiliary element and the diaphragm material and/or the filling material are/is poured in from the direction of the support element. The auxiliary element can be, for example, a plate, and so the plate closes the receiving space of the dam arrangement. When the diaphragm material has been filled, it collects over the auxiliary element in the receiving space and, after curing, forms the at least one diaphragm element.

It is advantageous when the transducer unit is pivoted and/or vibrated during and/or after the pouring-in of the diaphragm material and/or the filling material. As a result, the diaphragm material and/or the filling material becomes distributed.

Additionally or alternatively, it is advantageous when the diaphragm material and/or the filling material are/is cast under pressure. As a result, the manufacture can be accelerated.

It is advantageous when the diaphragm material and the filling material are cured one after the other, in particular, with heat input.

The invention also relates to a transducer unit, in particular a MEMS transducer unit, for converting deflections into electrical signals and/or electrical signals into deflections, preferably for generating and/or detecting sound waves in the audible wavelength spectrum and/or in the ultrasonic range.

The transducer unit comprises a support element and at least one transducer element arranged on the support element. With the aid of the transducer element, the deflections can be converted into electrical signals and/or electrical signals can be converted into deflections. The transducer element can comprise, for example, a piezoelectric actuator, which can convert electrical signals into deflections and deflections into electrical signals.

Furthermore, the transducer unit comprises a diaphragm unit coupled to the transducer element. With the aid of the diaphragm unit, the deflections can be transmitted onto a surrounding medium, for example, air, wherein, consequently, sound is generated. Additionally or alternatively, vibrations and/or a pressure of the medium can also cause the deflections of the diaphragm unit, which are transmitted onto the transducer element, wherein the transducer element generates the electrical signal from the deflections.

According to the invention, the diaphragm unit comprises a reinforcing element, which is coupled to the transducer element and onto which at least one flexible diaphragm element is cast, at least in some areas, and so the reinforcing element, together with the diaphragm element, at least partially forms the diaphragm unit.

Furthermore, the transducer unit can be designed according to one or multiple method features of the preceding description and/or the following description. Additionally or alternatively, a method step can also be carried out for the preceding method, in order to form a transducer unit, which has at least one feature of the following description.

It is advantageous when the transducer element and the diaphragm unit are arranged separately from one another. This means, the transducer element and the diaphragm unit are separate units, elements, or components. As a result, the transducer unit can have a modular design.

Additionally or alternatively, it is advantageous when the transducer element and the diaphragm unit are arranged spaced apart from one another. The transducer element and the reinforcing element and/or the at least one flexible diaphragm element can also be spaced apart from one another.

Additionally or alternatively, it is advantageous when the transducer element and the diaphragm unit are coupled to each other with the aid of a coupling element. The transducer element can also be coupled to the reinforcing element with the aid of the coupling element. Additionally or alternatively, the transducer element and the diaphragm unit, in particular the reinforcing element, can also be coupled to each other only and/or exclusively with the aid of the coupling element. Consequently, the transmission of the deflections between the transducer element and the diaphragm unit takes place only via the coupling element.

It is advantageous when the transducer element is arranged on the support element with the aid of at least one base element, in particular with the aid of at least two base elements. As a result, the transducer element is spaced apart from the support element.

It is advantageous when a diaphragm material and/or a filling material have/has a modulus of elasticity of less than 10 MPa, in particular less than 1 MPa. Preferably, the modulus of elasticity of the diaphragm material is greater than that of the filling material.

It is also advantageous when the diaphragm material and the filling material are different. Alternatively, the diaphragm material and the filling material can be identical.

BRIEF DESCRIPTION OF THE DRAWINGS

Further advantages of the invention are described in the following exemplary embodiments. Wherein.

DETAILED DESCRIPTION OF EXEMPLARY EMBODIMENTS

Figure 1:
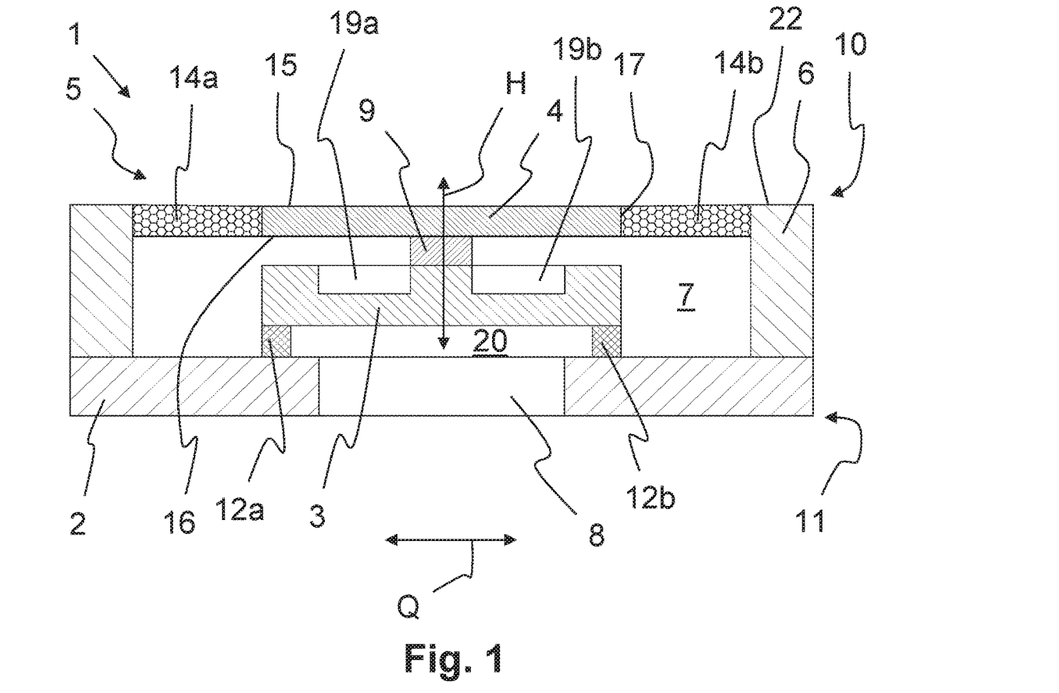
FIG. 1 shows a schematic cross section of a transducer unit comprising a transducer element and a diaphragm unit.

FIG. 1 shows a schematic cross section of a transducer unit 1. With the aid of the transducer unit 1, electrical signals can be converted into deflections. This takes place, for example, when the transducer unit 1 is utilized as a loudspeaker or as an actuator. Additionally or alternatively, deflections can also be converted into electrical signals with the aid of the transducer unit 1. This takes place, for example, when the transducer unit 1 is utilized as a microphone or a sensor. The transducer unit 1 can also be a MEMS transducer unit. With the aid of the deflections, for example, a pressure or a force can be formed.

The transducer unit 1 comprises a support element 2, on which at least one transducer element 3 is arranged. With the aid of the transducer element 3, the deflections can be converted into electrical signals and/or the electrical signals can be converted into deflections. The transducer element 3 can therefore be utilized, for example, for generating and/or detecting sound waves. Moreover, the transducer element 3 can be deflected in the direction of a stroke axis H, in order to thereby generate the deflections and/or the electrical signals. The transducer element 3 can comprise, for example, a substrate and at least one piezoelectric actuator. With the aid of the piezoelectric actuator, the electrical signals can be converted into deflections and/or the deflections can be converted into the electrical signals. The piezoelectric actuator can deflect or be deflected along the stroke axis H.

In addition, the transducer unit 1 comprises a diaphragm unit 5, which is coupled to the at least one transducer element 3. With the aid of the diaphragm unit 5, for example, vibrations can be transmitted, as deflections, from the transducer element 3 onto the surrounding air, so that sound is generated and the transducer unit 1 is therefore operated as a loudspeaker. Additionally or alternatively, with the aid of the diaphragm unit 5, sound waves in vibrations can also be detected as deflections, which are converted into an electrical signal by the transducer element 3. The transducer unit 1 can therefore be operated as a microphone. Of course, it does not depend on whether sound deflects the diaphragm unit 5. For example, the transducer unit 1 can also be a pressure or force sensor, and so a medium other than air deflects the diaphragm unit 5, wherein this deflection is converted into an electrical signal by the transducer element 3.

The at least one transducer element 3 is deflectable along a stroke axis H.

The transducer element 3 can comprise, for example, at least one piezoelectric element or piezoelectric actuator, which generates a voltage upon deflection and, itself, deflects upon application of a voltage. In a further exemplary embodiment, the transducer element 3 can also comprise a coil and a magnet. The transducer unit 1 can therefore also be an electrodynamic sound transducer.

The transducer unit 1 can also be any other sensor and/or actuator, however. For example, the transducer unit 1 can be a pressure or force sensor, which ascertains a pressure or a force on the basis of a deflection of the transducer element 3. As an actuator, the transducer unit 1 can also form a pressure or a force.

Moreover, as shown in FIG. 1 for example, the transducer unit 1 of the present exemplary embodiment comprises a dam arrangement 6, which, in particular together with the support element 2, delimits a receiving space 7. In this case, the transducer element 3 and the reinforcing element 4 desirably are arranged in the receiving space 7.

Moreover, in the present exemplary embodiment, a coupling element 9 is arranged between the transducer element 3 and the reinforcing element 4. Furthermore, with the aid of the coupling element 9, the diaphragm unit 5 and/or the reinforcing element 4 are spaced apart from the transducer element 3, and so the reinforcing element 4 can be prevented from impacting the transducer unit 3 upon deflection of the diaphragm unit 5 and/or the reinforcing element 4. The coupling element 9 can also be designed as one piece with the transducer element 3, the diaphragm unit 5, and/or the reinforcing element 4.

Moreover, as shown here, the diaphragm unit 5 can be separated or arranged separately from the transducer element 3. The diaphragm unit 5 and the transducer element 3 are arranged and/or designed so as to be separated from one another. The diaphragm unit 5 and the transducer element 3 are coupled to each other only with the aid of the coupling element 9. Due to the separate arrangement and/or design of the diaphragm unit 5 and the transducer element 3, the transducer unit 1 has a modular design. As a result, the transducer unit 1 can have, for example, a layered structure. For the case in which a component of the transducer unit 1 is damaged or is not correctly arranged and/or designed, this component can be removed or rearranged or redesigned.

The transducer unit 1 also has a top side 10 and an underside 11 positioned opposite thereto, in particular in the direction of the stroke axis H. The diaphragm unit 5 is arranged at the top side 10. The support element 2 is arranged in the area of the underside 11.

The reinforcing element 4 also comprises a first side face 15 and a second side face 16, wherein the two side faces 15, 16 are spaced apart from one another in the direction of the stroke axis H. The first side face 15 faces the top side 10.

Furthermore, the first side face 15 forms a portion of the top side 10. The first side face 15 faces away from the transducer element 3. The second side face 16 faces toward the transducer element 3. Furthermore, the first side face 15 or the reinforcing element 4 is arranged in such a way that the first side face 15 is flush with the dam arrangement 6. As shown in FIG. 1 for example, the first side face 15 is flush with a dam top side 22.

Furthermore, the diaphragm unit 5 comprises at least one flexible diaphragm element 14*a, b*, which, in the method for manufacturing the transducer unit 1, is formed by way of fluid and curable diaphragm material being cast onto the reinforcing element 4. The diaphragm unit 5 therefore comprises the reinforcing element 4 and the at least one diaphragm element 14*a, b*.

Due to the casting of the diaphragm material onto the reinforcing element 4 in order to form the at least one diaphragm element 14*a, b*, nearly any shape of the diaphragm unit 5 can be considered, without producing the diaphragm element 14*a, b* in advance. In addition, due to the casting-on of the diaphragm material, tolerances can be compensated for during manufacture. Furthermore, the acoustic properties of the transducer unit 1—when utilized as a sound transducer—can be adapted in nearly any way when, for example, less or more diaphragm material is cast onto the reinforcing element 4, and so a thinner or thicker diaphragm element 14*a, b* is formed. Such a decision can be made during the manufacturing process. With the aid of the casting-on of the at least one diaphragm element 14*a, b*, the manufacturing method becomes more flexible.

Furthermore, the reinforcing element 4 comprises a peripheral side 17, which forms a peripheral surface. The peripheral side 17 extends completely around the reinforcing element 4. The peripheral side 17 faces the dam arrangement 6. In this case, the at least one diaphragm element 14*a, b* is cast onto the peripheral side 17, at least in some areas. Furthermore, the at least one diaphragm element 14*a, b* extends between the reinforcing element 4, in particular the peripheral side 17, and the dam arrangement 6.

According to the present exemplary embodiment, two diaphragm elements 14*a, b* are shown. When the diaphragm element 14*a, b* extends completely around the reinforcing element 4, the diaphragm unit 5 comprises only one diaphragm element 14. The two diaphragm elements 14*a, b* shown here can therefore be contiguous. The diaphragm element 14 can extend completely around the reinforcing element 4 when the reinforcing element 4 is spaced completely apart from the dam arrangement 6, i.e., has no contact to the dam arrangement 6.

The at least one diaphragm element 14*a, b* can be flush with the first side face 15 and/or the second side face 16 of the reinforcing element 4, as shown here.

According to the present exemplary embodiment shown in FIG. 1 for example, the reinforcing element 4 is arranged in the center between the dam arrangement 6. The at least one diaphragm element 14*a, b* is therefore also symmetrical.

According to the present exemplary embodiment shown in FIG. 1 for example, the transducer unit 1 comprises at least one base element 12*a, b*, with the aid of which the transducer element 3 is arranged on the support element 2. With the aid of the at least one base element 12*a, b*, the transducer unit 3 can be spaced apart from the support element 2, and so the transducer unit 3 does not impact the support element 2 upon deflection. Two base elements 12*a, b* are shown in this case.

Moreover, the support element 2 according to the present exemplary embodiment comprises a passage opening 8. With the aid of the passage opening 8, acoustics of the transducer unit 1 can be adapted or improved when the transducer unit 1 is a sound transducer. The passage opening 8 shown in FIG. 1 for example is arranged on the underside 11. Furthermore, the passage opening 8 of the present exemplary embodiment is arranged between the two base elements 12*a, b*. The passage opening 8 also can be formed during the manufacturing process.

Furthermore, as shown in FIG. 1 for example, the at least one transducer element 3 comprises at least one recess 19*a, b*. Two recesses 19*a, b* are shown in the exemplary embodiment of FIG. 1 for example. However, in an alternative embodiment, there also can be only one single recess 19, which extends around the coupling element 9 as shown here. With the aid of the recess 19*a, b*, the transducer element 3 can better deflect or be deflected. The regions occupied by the at least one recess 19*a, b* can form a predetermined bending region or a predetermined deflection region.

As shown in FIG. 1 for example, the transducer unit 1 also comprises a back volume 20, which is arranged on the side of the transducer element 3 facing away from the diaphragm unit 5. The back volume 20 also can partially include the passage opening 8. The acoustics also can be adapted with the aid of the back volume 20. The back volume 20 also can be formed during the manufacturing process.

Figure 2:
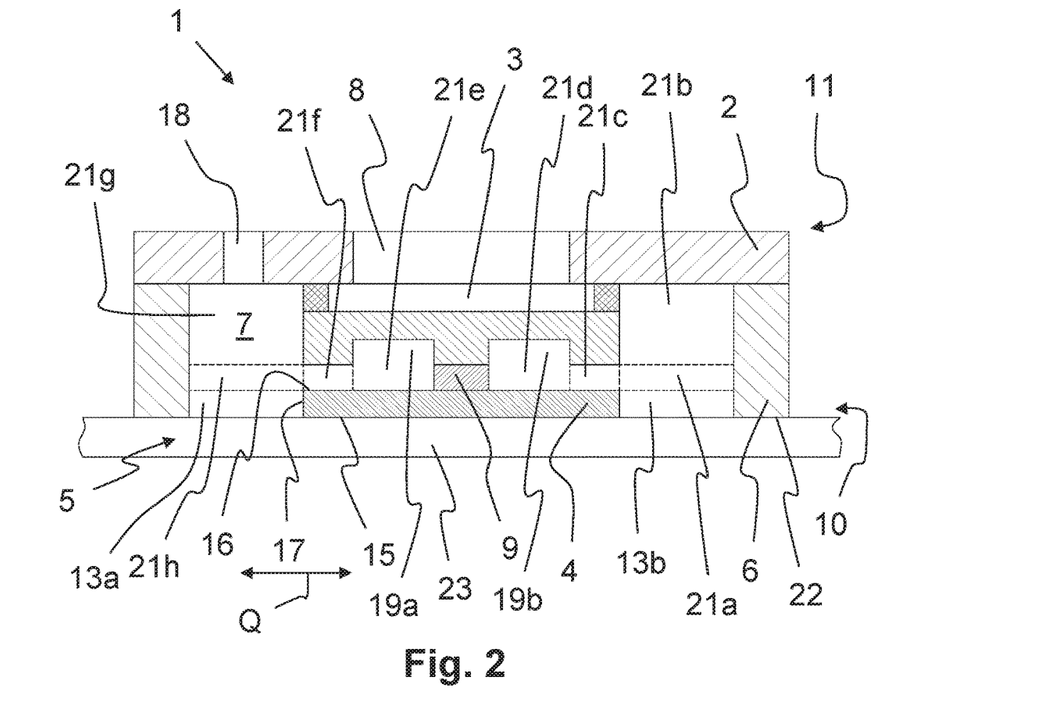
FIG. 2 shows a schematic cross section of a transducer unit comprising a transducer element and a diaphragm unit on an auxiliary element.

FIG. 2 shows an embodiment of the transducer unit 1 that is configured to include sections for pouring in at least the diaphragm material.

Furthermore, for the sake of brevity, features and their effect that have already been described with reference to the preceding FIG. 1 need not be explained again. Furthermore, as compared to the preceding FIG. 1 and/or the following FIG. 3 and FIG. 4, identical features or at least similarly acting features have the same reference numbers. For the sake of clarity, for example, features can also be described first in the following figures.

The transducer unit 1 is shown in another or opposite orientation in this case. In FIG. 1, the top side 10 was at the top, whereas the underside 11 is at the top in FIG. 2.

According to the present exemplary embodiment shown in FIG. 2 for example, a pouring port 18 is defined through the support element 2. The pouring port 18 is arranged on the underside 11 of the transducer unit 1 in this case. During the process of manufacturing the transducer unit 1, the transducer unit 1 can be turned and/or oriented in such a way that the underside 11 is at the top, and so the fluid diaphragm material can be poured in through the pouring port 18 into the receiving space 7.

As shown in FIG. 2 for example, the transducer unit 1 can be placed upon an auxiliary element 23 during the manufacturing process. The auxiliary element 23 is a plate in this case or is at least designed in the shape of a plate. With the aid of the auxiliary element 23, the receiving space 7 can be delimited or sealed at the top side 10, and so the diaphragm material is filled into the receiving space 7 and is retained there. The auxiliary element 23 is shown in FIG. 2 without the normal cross-hatch shading in this case, as the auxiliary element 23 will not remain part of the transducer unit 1 at the conclusion of the manufacturing thereof.

According to the present exemplary embodiment shown in FIG. 2 for example, the transducer unit 1, in particular the receiving space 7, comprises at least one diaphragm volume 13*a, b*, which is filled with the diaphragm material and in which the at least one diaphragm element 14*a, b* (cf. FIG. 1) is formed after curing.

The diaphragm volume 13*a, b* is delimited in this case by the dam arrangement 6, the reinforcing element 4, and the auxiliary element 23. The dam arrangement 6 comprising the dam top side 22 and the reinforcing element 4 comprising the first side face 15 have contact to the auxiliary element 23 in this case. Furthermore, the dam arrangement 6 comprising the dam top side 22 and the reinforcing element 4 comprising the first side face 15 rest on the auxiliary element 23 in a planar manner. A contact surface between the auxiliary element 23 and the reinforcing element 4 and/or the dam arrangement 6 is at least tight for the diaphragm material so that the diaphragm material does not seep past these interstices between these contact surfaces.

The diaphragm material can therefore be filled through the pouring port 18 from the direction of the underside 11 into the receiving space 7. The diaphragm volume 13a, b is arranged at the lowest point in this case, and so the diaphragm material automatically flows, i.e., by gravity, into the diaphragm volume. After curing, the at least one diaphragm element 14a, b is formed.

As shown in FIG. 2 for example, the receiving space 7 can also be further subdivided. In addition to the diaphragm volume, the transducer unit 1 or the receiving space 7 can comprise at least one filling volume 21, into which a filling material can be filled.

The diaphragm material and the filling material can be filled in any order. For example, as shown in the exemplary embodiment shown in FIG. 2, the diaphragm material can be filled first, since the diaphragm volume 13a, b is arranged at the lowest area (with respect to the direction of flow due to gravity). If the diaphragm material has been filled, it can be cured, for example, by supplying heat, and so the at least one diaphragm element 14a, b is formed.

Thereafter, the filling material can be filled into the filling volume 21, for example, also through the pouring port 18.

According to the present exemplary embodiment shown in FIG. 2 for example, the receiving space 7 is subdivided, in addition into the diaphragm volume 13a, b, into multiple filling volumes 21a-h.

A first filling volume 21a is arranged between the second diaphragm volume 13b and the support element 2 in this case and adjoins the second diaphragm volume 13b. A second filling volume 21b is arranged between the first filling volume 21a and the support element 2 and adjoins both of these.

A third filling volume 21c is arranged between the reinforcing element 4 and the transducer element 3. A fourth filling volume 21d is also arranged between the reinforcing element 4 and the transducer element 3 and at least partially intersects the recess 19b. A fifth filling volume 21e is also arranged between the reinforcing element 4 and the transducer element 3 and at least partially intersects the recess 19a. A sixth filling volume 21f is arranged between the reinforcing element 4 and the transducer element 3.

A seventh filling volume 21g is arranged between the support element 2 and an eighth filling volume 21h, wherein the eighth filling volume 21h adjoins the diaphragm volume 13a.

The filling material for the various filling volumes 21a-h is also fluid, as is the diaphragm material, and is curable, for example, by supplying heat.

After the filling material has been filled, it is also cured, wherein this can also take place successively.

With the aid of the various filling volumes 21a-g filled with filling material, for example, the acoustic property of the transducer unit 1 can be adapted when the transducer unit 1 is operated as a sound transducer. For this purpose, the filling material, when cured, advantageously has a modulus of elasticity of less than 10 MPa or, preferably, less than 1 MPa.

With the aid of the adaptation of the acoustic properties of the transducer unit 1 by way of the cured filling material, other elements for adapting the acoustic properties can be dispensed with. For example, while grids can be inserted into the receiving space 7 in order to adapt the acoustic properties, such grids must be produced in complicated processes, however. Furthermore, if such grids have incorrect dimensions, then the grids with incorrect dimensions cannot be utilized. By comparison, the filling material in accordance with an aspect of the present invention can be filled in a simple step and automatically adapts to the receiving space 7 or the corresponding filling volume 21 without concern for incorrect dimensioning.

Figure 3:
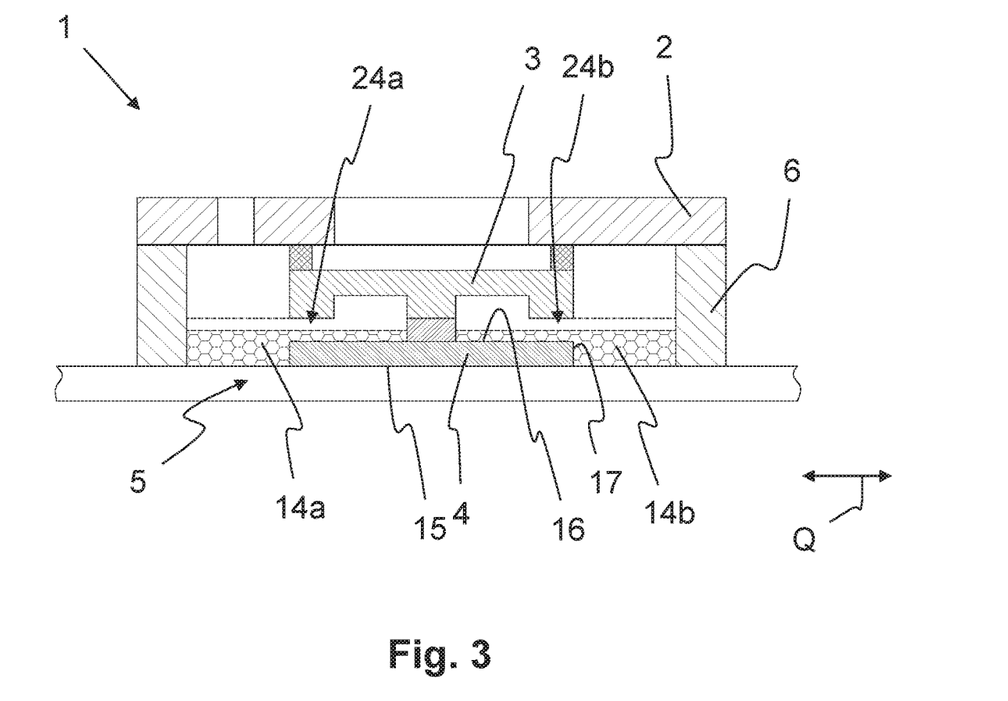
FIG. 3 shows a schematic cross section of a transducer unit comprising a transducer element and a diaphragm unit.

FIG. 3 shows an exemplary embodiment of the transducer unit 1 comprising a diaphragm unit 5.

Furthermore, for the sake of brevity, features and their effect that have already been described with reference to the preceding figures are not explained again. Furthermore, as compared to the preceding figures and/or the following figures, identical features or at least similarly acting features have the same reference numbers. For the sake of clarity, for example, features can also be described first in the following figures.

According to the present exemplary embodiment shown in FIG. 3, the at least one diaphragm element 14a, b extends at least partially over the second side face 16 of the reinforcing element 4. As a result, a connection between the reinforcing element 4 and the at least one diaphragm element 14a, b can be reinforced. In this case, the at least one diaphragm element 14a, b completely covers the second side face 16.

Figure 4:
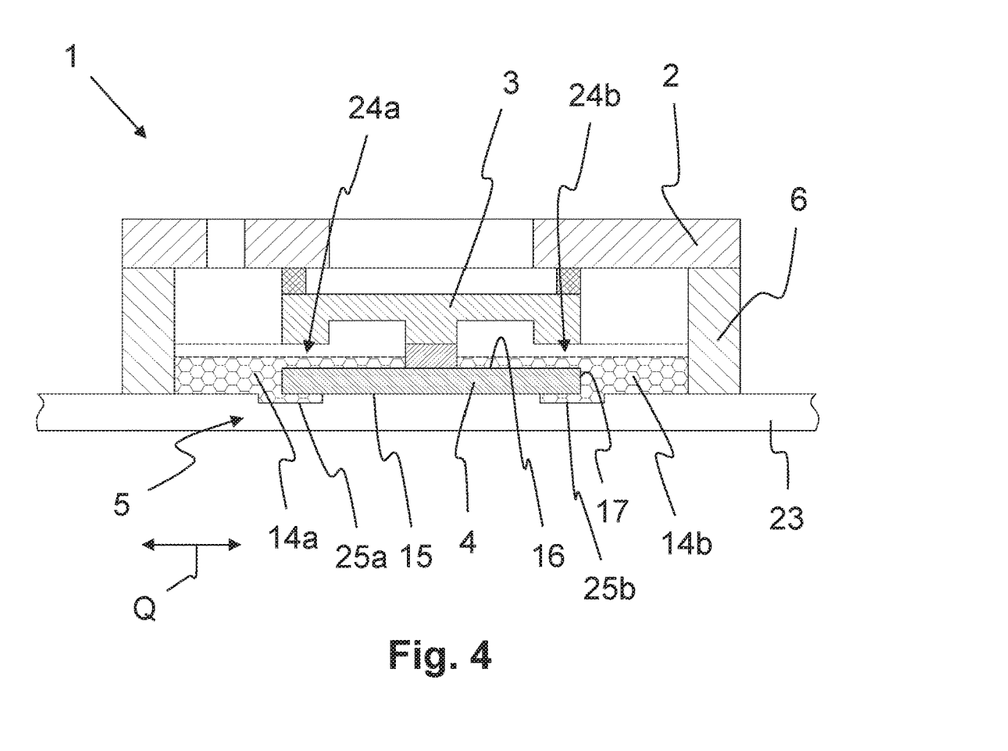
FIG. 4 shows a schematic cross section of a transducer unit comprising a transducer element and a diaphragm unit.

Additionally or alternatively, as shown in FIG. 4 for example, the at least one diaphragm element 14a, b can also extend at least partially over the first side face 15. When the diaphragm element 14a, b at least partially extends over both side faces 15, 16, the diaphragm element 14a, b encompasses the reinforcing element 4, and so the connection between the reinforcing element 4 and the at least one diaphragm element 14a, b is reinforced.

During the manufacturing process, for example, diaphragm material is filled into the receiving space 7 until the diaphragm material at least partially covers the second side face 16, and so the diaphragm material can be cured.

Furthermore, as shown in FIGS. 3 and 4, the reinforcing element 4 comprises at least one edge area 24a, b, which faces the dam arrangement 6. The reinforcing element 4 can also comprise only one edge area 24, which extends around the reinforcing element 4. The at least one diaphragm element 14a, b can also be arranged at least in the edge area 24a, b.

FIG. 4 shows the transducer unit 1 comprising a diaphragm unit 5.

Furthermore, for the sake of brevity, features and their effect that already have been described with reference to the preceding figures are not explained once more. Furthermore, as compared to the preceding figures and/or the following figures, identical features or at least similarly acting features have the same reference numbers. For the sake of clarity, for example, features can also be described first in the following figures.

According to the present exemplary embodiment shown in FIG. 4, the at least one diaphragm element 14a, b is also at least partially arranged on the first side face 15. The auxiliary element 23 used during manufacture of this embodiment shown in FIG. 4 comprises at least one recess 25a, b, into which the diaphragm material can flow, in order to form the diaphragm element 14a, b at least partially on the first side face 15 after curing. With the aid of the shape of the recesses 25a, b, the area of the at least one diaphragm element 14a, b on the first side face 15 can also be established. As shown here, the diaphragm element 14a, b can be arranged at least in the edge area 24a, b of the reinforcing element on the first side face 15.

In an alternative exemplary embodiment, the at least one diaphragm element 14a, b also can be arranged only on the first side face 15. The diaphragm material is filled into the receiving space 7 at most for as long as it takes for it to be flush with the second side face 16.

The present invention is not limited to the represented and described exemplary embodiments. Modifications within the scope of the claims are also possible, as is any combination of the features, even if they are represented and described in different exemplary embodiments.

LIST OF REFERENCE NUMERALS 1 transducer unit
2 support element
3 transducer element
4 reinforcing element
5 diaphragm unit
6 dam arrangement
7 receiving space
8 passage opening
9 coupling element
10 top side
11 underside
12 base element
13 diaphragm volume
14 diaphragm element
15 first side face
16 second side face
17 peripheral side
18 pouring port
19 recess
20 back volume
21 filling volume
22 dam top side
23 auxiliary element
24 edge area
25 recess
H stroke axis
Q transverse direction

What is claimed is:

1. A method for manufacturing a transducer unit for converting electrical signals into deflections and/or converting deflections into electrical signals, the transducer unit including a transducer element arranged on a support element and coupled to a diaphragm unit, which is deflectable along a stroke axis, the method comprising the steps of:
forming a pouring port in the support element;
casting a fluid and curable diaphragm material onto a reinforcing element of the diaphragm unit to form a flexible diaphragm element, wherein the diaphragm unit is arranged at a top side of the transducer unit and the pouring port is arranged at an underside of the transducer unit and the diaphragm material is poured through the pouring port from the underside of the transducer unit; and
wherein the reinforcing element is coupled or coupleable to the transducer element, and so that the diaphragm unit is at least partially formed by the flexible diaphragm element and the reinforcing element.

2. A method for manufacturing a transducer unit for converting electrical signals into deflections and/or converting deflections into electrical signals, the transducer unit including a transducer element arranged on a support element and coupled to a diaphragm unit, which is deflectable along a stroke axis, the method comprising the steps of:
casting a fluid and curable diaphragm material onto a reinforcing element of the diaphragm unit to form a flexible diaphragm element, wherein the reinforcing element is coupled or coupleable to the transducer element, and so that the diaphragm unit is at least partially formed by the flexible diaphragm element and the reinforcing element;
wherein the reinforcing element is arranged in such a way that the diaphragm unit is formed separately from the transducer element.

3. The method as claimed in claim 1, wherein the transducer element is coupled to the reinforcing element before the step of casting the fluid and curable diaphragm material onto the reinforcing element to form the diaphragm element on the reinforcing element.

4. The method as claimed in claim 1, wherein the transducer element is arranged in a receiving space of a dam arrangement so that the transducer element and/or the reinforcing element are/is completely bordered by the dam arrangement.

5. The method as claimed in claim 4, wherein the diaphragm element is cast onto the reinforcing element in a transverse direction oriented transversely to the stroke axis and/or that the diaphragm element is cast onto the dam arrangement, and/or that the diaphragm element is arranged between the reinforcing element and the dam arrangement.

6. The method as claimed in claim 1, wherein the diaphragm element is cast onto a peripheral side of the reinforcing element and/or that the diaphragm material is cast, in the direction of the stroke axis, at least partially, in an edge area, onto a first side face and/or a second side face of the reinforcing element so that the diaphragm element is formed at least partially at the first side face and/or the second side face of the reinforcing element.

7. The method as claimed in claim 4, wherein the dam arrangement, the transducer element and/or the reinforcing element are arranged with respect to one another in such a way that the reinforcing element is spaced apart from the dam arrangement and/or that the diaphragm element is arranged in such a way that it is spaced apart from the transducer element.

8. The method as claimed in claim 4, wherein the reinforcing element and/or the transducer element are/is arranged coaxially to the dam arrangement.

9. The method as claimed in claim 1, wherein a coupling element is arranged between the transducer element and the reinforcing element.

10. The method as claimed in claim 4, wherein, in order to form the diaphragm element, the diaphragm material is poured into a diaphragm volume, which adjoins the reinforcing element in a transverse direction oriented transversely to the stroke axis, and/or is arranged between the reinforcing element and the dam arrangement in the transverse direction.

11. The method as claimed in claim 10, wherein the dam arrangement and the support element delimit a receiving space with at least one filling volume in the receiving space, and the at least one filling volume is cast with a fluid and curable filling material.

12. The method as claimed in claim 11, wherein the filling material is poured into the receiving space before and/or after the diaphragm material is cast or has been cast onto the reinforcing element.

13. The method as claimed in claim 4, further comprising the steps of forming a pouring port in the support element, and wherein the reinforcing element and/or the dam arrangement are/is placed upon an auxiliary element and the diaphragm material and/or the filling material are/is poured through the pouring port from the direction of the support element.

14. The method as claimed in claim 13, wherein the transducer unit is pivoted and/or vibrated during and/or after the pouring-in of the diaphragm material and/or the filling material, and/or that the diaphragm material and/or the filling material are/is cast under pressure.

\* \* \* \* \*